(12) United States Patent
Song

(10) Patent No.: US 11,997,802 B2
(45) Date of Patent: May 28, 2024

(54) INVERTER MODULE

(71) Applicant: LS ELECTRIC CO., LTD., Anyang-si (KR)

(72) Inventor: Young-Hoon Song, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 402 days.

(21) Appl. No.: 17/431,770

(22) PCT Filed: Sep. 11, 2019

(86) PCT No.: PCT/KR2019/011819
§ 371 (c)(1),
(2) Date: Aug. 18, 2021

(87) PCT Pub. No.: WO2020/171329
PCT Pub. Date: Aug. 27, 2020

(65) Prior Publication Data
US 2022/0117096 A1  Apr. 14, 2022

(30) Foreign Application Priority Data

Feb. 18, 2019  (KR) .......................... 10-2019-0018686

(51) Int. Cl.
*H05K 5/00* (2006.01)
*H05K 1/14* (2006.01)
*H05K 7/14* (2006.01)

(52) U.S. Cl.
CPC ............. *H05K 5/0026* (2013.01); *H05K 1/14* (2013.01); *H05K 7/1427* (2013.01)

(58) Field of Classification Search
CPC ...... H05K 5/0026; H05K 1/14; H05K 7/1427; H05K 7/14322; H05K 7/14324;
(Continued)

(56) References Cited

U.S. PATENT DOCUMENTS 4,401,351 A * 8/1983 Record ................... H05K 7/02
  361/688
4,939,624 A * 7/1990 August ................ H01R 12/523
  361/823

(Continued)

FOREIGN PATENT DOCUMENTS

DE         29916195 U1    12/1999
JP         H05251142 A     9/1993
(Continued)

OTHER PUBLICATIONS

International Search Report for related International Application No. PCT/KR2019/011819; report dated Aug. 27, 2020; (5 pages).
(Continued)

*Primary Examiner* — Anthony M Haughton
*Assistant Examiner* — Theron S Milliser
(74) *Attorney, Agent, or Firm* — K&L Gates LLP

(57) ABSTRACT

The present disclosure relates to an inverter module which can be coupled to another inverter module, the inverter module comprising: a main PCB having a main substrate on which a plurality of circuits are printed; a plurality of sub-PCBs coupled to the main PCB and each having one end exposed through the main PCB; and a case for receiving the main PCB and the sub-PCBs, wherein when the inverter module is coupled to another inverter module, the ends of the sub-PCBs exposed to the outside of the case are coupled to the another adjacent inverter module. According to the present disclosure, a plurality of inverter modules can be connected and used as one inverter system, and thus an inverter system having a required capacity can be easily implemented.

12 Claims, 8 Drawing Sheets

(58) Field of Classification Search
CPC ........ H02M 1/32; H02M 1/327; H02M 7/003; H02M 7/48
See application file for complete search history.

(56) References Cited

U.S. PATENT DOCUMENTS

| | | | | |
|---|---|---|---|---|
| 5,604,662 | A * | 2/1997 | Anderson | H05K 7/1422 |
| 5,913,926 | A * | 6/1999 | Anderson | G06F 1/187 |
| | | | | 361/600 |
| 5,930,112 | A | 8/1999 | Babinski et al. | |
| 6,640,235 | B1 * | 10/2003 | Anderson | G11B 33/142 |
| | | | | 361/679.48 |
| 7,435,097 | B2 * | 10/2008 | Mecker | H05K 1/181 |
| | | | | 439/74 |
| 7,656,671 | B2 * | 2/2010 | Liu | G06F 1/185 |
| | | | | 361/752 |
| 8,611,104 | B1 | 12/2013 | Mogilevski | |
| 9,247,675 | B2 | 1/2016 | Higuchi et al. | |
| 9,748,689 | B1 | 8/2017 | Kim et al. | |
| 9,825,399 | B2 | 11/2017 | Kim et al. | |
| 9,979,320 | B2 * | 5/2018 | Singh | H05K 1/144 |
| 2006/0164820 | A1 * | 7/2006 | Mecker | H05K 1/181 |
| | | | | 361/760 |
| 2009/0141458 | A1 * | 6/2009 | Liu | G06F 1/185 |
| | | | | 361/728 |
| 2014/0084837 | A1 * | 3/2014 | Tio | H02P 27/04 |
| | | | | 318/519 |
| 2014/0098498 | A1 | 4/2014 | Huang et al. | |
| 2014/0153197 | A1 | 6/2014 | Yen | |
| 2018/0062539 | A1 * | 3/2018 | Singh | H05K 1/165 |

FOREIGN PATENT DOCUMENTS

| | | |
|---|---|---|
| JP | 2010198990 A | 9/2010 |
| JP | 2013031250 A | 2/2013 |
| KR | 20170104313 A | 9/2017 |
| KR | 20180002789 U | 10/2018 |
| WO | 2008028205 A1 | 3/2008 |

OTHER PUBLICATIONS

Written Opinion for related International Application No. PCT/KR2019/011819; report dated Aug. 27, 2020; (6 pages).

European Search Report for related European Application No. 19915842.9; action dated Mar. 17, 2022; (12 pages).

* cited by examiner

INVERTER MODULE

CROSS-REFERENCE TO RELATED APPLICATIONS

This application is the National Stage filing under 35 U.S.C. 371 of International Application No. PCT/KR2019/011819, filed on Sep. 11, 2019, which claims the benefit of earlier filing date and right of priority to Korea utility model Application No. 10-2019-0018686 filed on Feb. 18, 2019, the contents of which are all hereby incorporated by reference herein in their entirety.

FIELD

The present disclosure relates to an inverter module that supplies power to a motor.

BACKGROUND

In general, an inverter is a power conversion device that receives commercial AC power, converts the AC power into DC power, converts the DC power into AC power suitable for a motor (or a pump), and then supplies the AC power to the motor. The inverter functions to increase energy efficiency by efficiently controlling the motor to reduce power consumption.

A typical inverter may include a rectifier that converts three-phase AC voltage into DC voltage, a capacitor that stores the DC voltage converted by the rectifier, and an inverter unit that converts the stored DC voltage into an AC voltage suitable for the motor and provides the AC voltage to the motor.

The rectifier, the capacitor, the inverter unit, etc. as above-described are mounted in a form of a component having a predefined size and on a PCB (Printed Circuit Board). The above-described components communicate with each other or are electrically connected to each other as needed. Such connection or communication may be made via a circuit on a PCB. Alternatively, the connection or communication between the components requiring electrical connection or communication may be made via a separate component mounted on the PCB. A plurality of PCBs are used based on a number of functional units or components of the inverter. The PCBs and the components are accommodated in a housing, thereby constituting one inverter. An example of such an inverter is disclosed in Korea Utility Application Publication No. 20-2018-0002789.

However, conventionally, when a required inverter capacity is 300 KW, an inverter with 300 KW capacity is designed and used. When an inverter with 100 KW or 200 KW capacity is required, an inverter with 300 KW capacity may not be used. Thus, an inverter with 100 KW or 200 KW capacity is separately manufactured and used.

Therefore, when there are a plurality of required target capacities, a plurality of inverters must be designed and manufactured to suit the respective capacities. This causes inconvenience and increases a manufacturing cost.

SUMMARY

A purpose of the present disclosure is to provide a plurality of inverter modules that may be interconnected to each other to implement a predefined inverter system.

Purposes of the present disclosure are not limited to the above-mentioned purpose. Other purposes and advantages of the present disclosure that are not mentioned above may be understood based on following descriptions, and will be more clearly understood with reference to embodiments of the present disclosure. Further, it will be readily apparent that the purposes and advantages of the present disclosure may be realized using means and combinations thereof indicated in the Claims.

In one embodiment of the present disclosure, an inverter module to be coupled to a further inverter module is disclosure. The inverter module includes a main printed circuit board (PCB) including a main board; a plurality of auxiliary PCBs coupled to the main PCB, wherein each auxiliary PCB has one end passing through the main PCB and exposed outwardly; and a casing for accommodating the main PCB and the auxiliary PCBs, wherein one end of at least one of the plurality of auxiliary PCBs is exposed out of the casing and is coupled to the further inverter module adjacent to the inverter module.

The main PCB further includes a plurality of first connectors formed on one face of the main board, wherein each first connector has a slit passing therethrough, wherein each auxiliary PCB is inserted into the slit.

The main PCB further includes a plurality of second connectors formed on an opposite face of the main board, wherein each second connector has a slit passing therethrough, wherein the auxiliary PCB passing through the slit of the first connector is inserted into the slit of the second connector.

Each of the plurality of auxiliary PCBs includes: an auxiliary board; an edge connector disposed at one side of the auxiliary board and passing through the first connector; and a third connector disposed at an opposite side of the auxiliary board, wherein a plurality of slots electrically connected to a circuit of the auxiliary board are disposed on the edge connector, wherein an edge connector of the further inverter module is inserted into the third connector.

a plurality of slots are disposed on the first connector, face toward each other, and are electrically connected to the slots on the edge connector.

A plate plane of the auxiliary board is perpendicular to a plate plane of the main board.

The casing has a plurality of slits passing through both opposing side faces thereof, wherein one end of the at least one auxiliary PCB passes through the slits of one of the both opposing side faces of the casing and protrudes out of one of the both opposing side faces of the casing.

Further, in one embodiment of the present disclosure, an inverter module to be coupled to a further inverter module having the same capacity as a capacity of the inverter module is disclosed. The inverter module includes a lower casing having a lower receiving space defined therein; an upper casing coupled to a top of the lower casing and having an upper receiving space defined therein; a plate-shaped middle plate coupled to and disposed between the lower casing and the upper casing; a main PCB having one end coupled to the middle plate and the other end extending in a direction away from the middle plate, wherein the main PCB is accommodated in the upper receiving space; and a plurality of auxiliary PCBs, wherein each of the plurality of auxiliary PCBs has one end coupled to the main PCB and passing through the main PCB, wherein one end of each auxiliary PCB is exposed out of the upper casing while each auxiliary PCB is accommodated in the upper receiving space, wherein when the inverter module is coupled to the further inverter module, one end of each auxiliary PCB exposed out of the upper casing is inserted into the further inverter module adjacent to the inverter module.

The main PCB includes: a main board; and a plurality of first connectors formed on one face of the main board, wherein each first connector has a slit passing therethrough, wherein each auxiliary PCB is inserted into the slit.

The main PCB further includes a plurality of second connectors formed on an opposite face of the main board, wherein each second connector has a slit passing therethrough, wherein the auxiliary PCB passing through the slit of the first connector is inserted into the slit of the second connector.

Each of the plurality of auxiliary PCBs includes: an auxiliary board; an edge connector disposed at one side of the auxiliary board and passing through the first and second connectors; and a third connector disposed at an opposite side of the auxiliary board, wherein a plurality of slots electrically connected to a circuit of the auxiliary board are disposed on the edge connector, wherein an edge connector of the further inverter module is inserted into the third connector.

A plurality of slots are disposed on the first connector, face toward each other, and are electrically connected to the slots on the edge connector.

A plate plane of the auxiliary board is perpendicular to a plate plane of the main board.

The casing has a plurality of slits passing through both opposing side faces thereof, wherein one end of the at least one auxiliary PCB passes through the slits of one of the both opposing side faces of the casing and protrudes out of one of the both opposing side faces of the casing.

In the inverter system according to the present disclosure, the inverter may be modularized and a plurality of inverter modules may be connected to each other to constitute one inverter. Thus, an inverter system suitable for a required target capacity may be easily implemented.

Further, the inverter module according to the present disclosure may be simply connected to another inverter module adjacent thereto without separate coupling means. Accordingly, the interconnection between the plurality of inverter modules is facilitated, so that assemblability thereof is improved and appearance thereof is improved. Because the inverter modules are interconnected to each other, an inverter system suitable for a required target capacity may be easily implemented.

The above-described effects, and specific effects of the present disclosure as not mentioned above will be described based on specific details for carrying out the disclosure.

DETAILED DESCRIPTION

Figure 1:
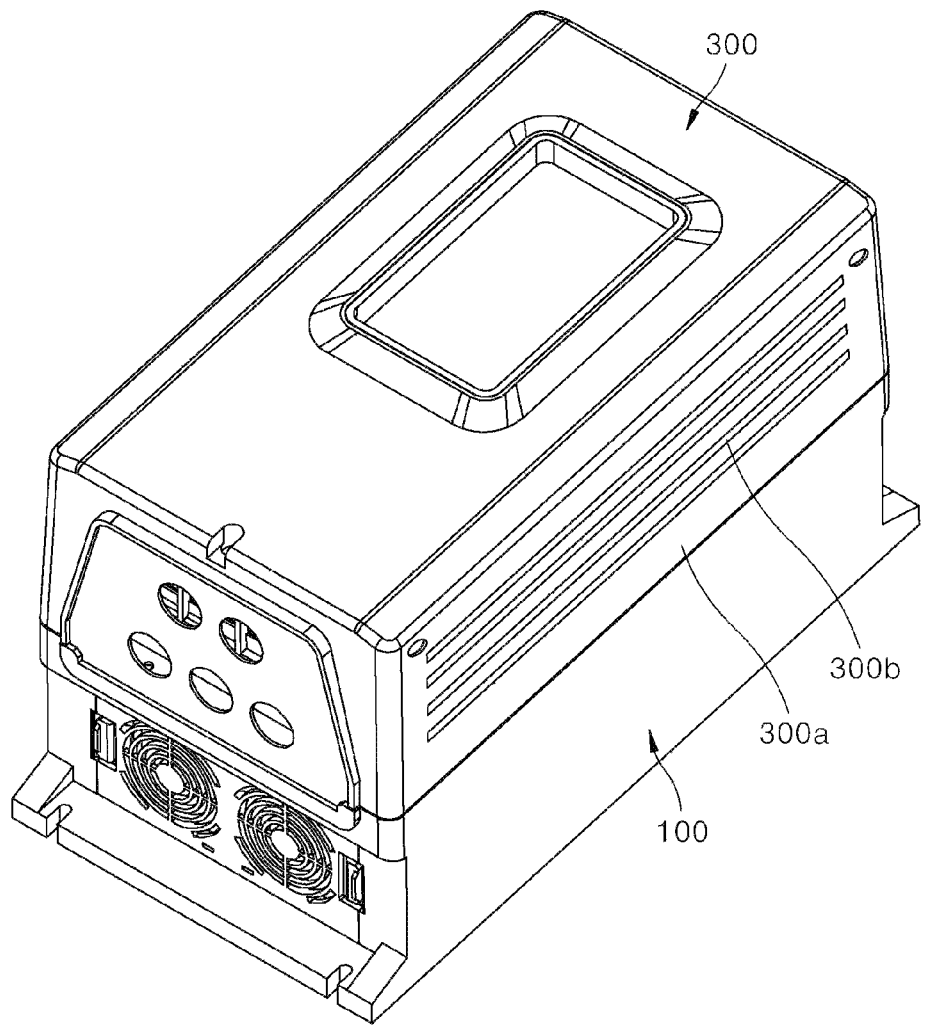
FIG. 1 is a perspective view showing an inverter module according to one embodiment of the present disclosure.

The above objects, features and advantages will be described in detail later with reference to the accompanying drawings. Accordingly, a person with ordinary knowledge in the technical field to which the present disclosure belongs will be able to easily implement the technical idea of the present disclosure. In describing the present disclosure, when it is determined that a detailed description of a known component related to the present disclosure may unnecessarily obscure gist the present disclosure, the detailed description is omitted. Hereinafter, a preferred embodiment according to the present disclosure will be described in detail with reference to the accompanying drawings. In the drawings, the same reference numerals are used to indicate the same or similar elements.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Figure 2:
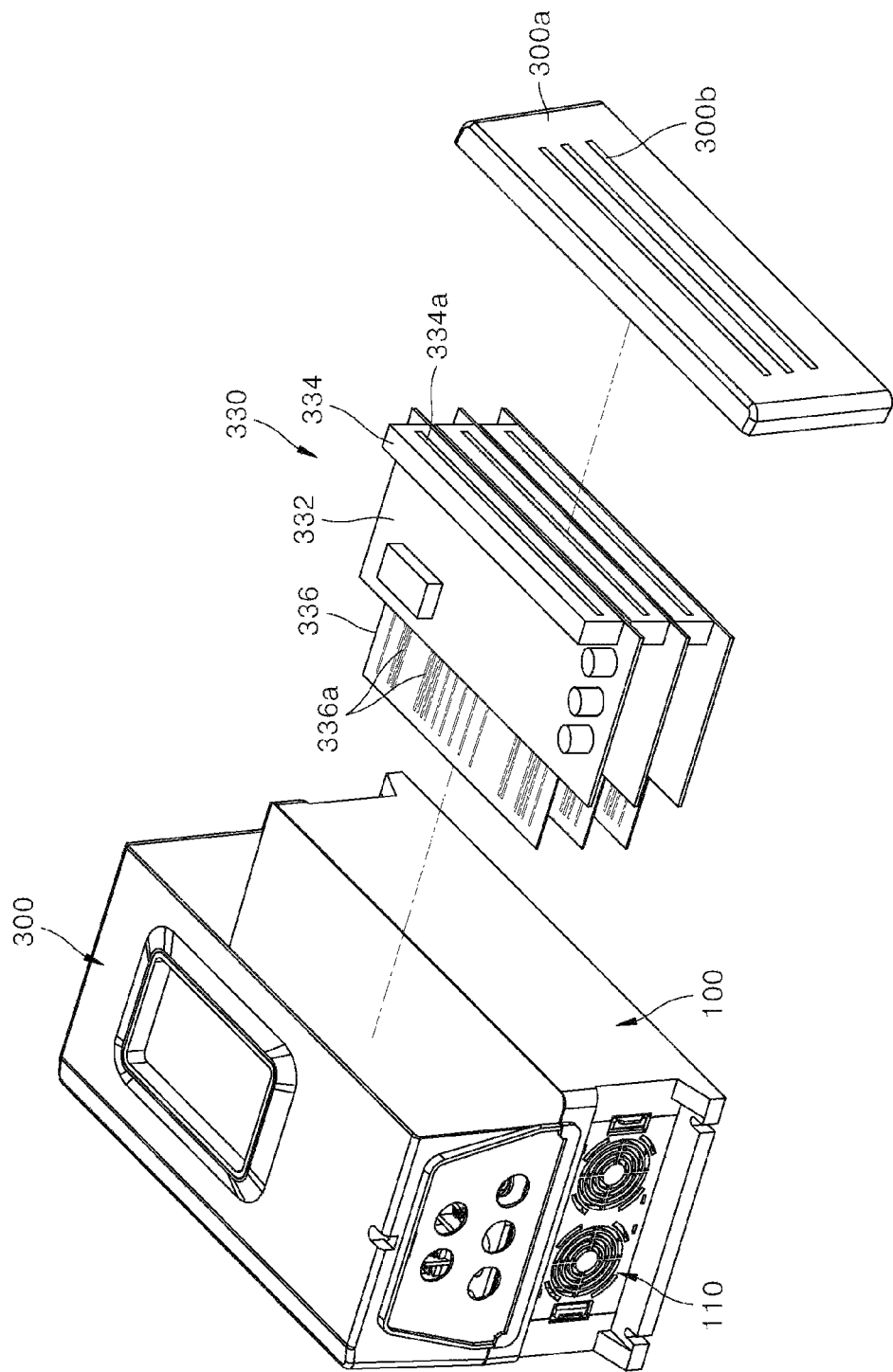
FIG. 2 is a partial exploded perspective view of the inverter module according to FIG. 1.
Figure 3:
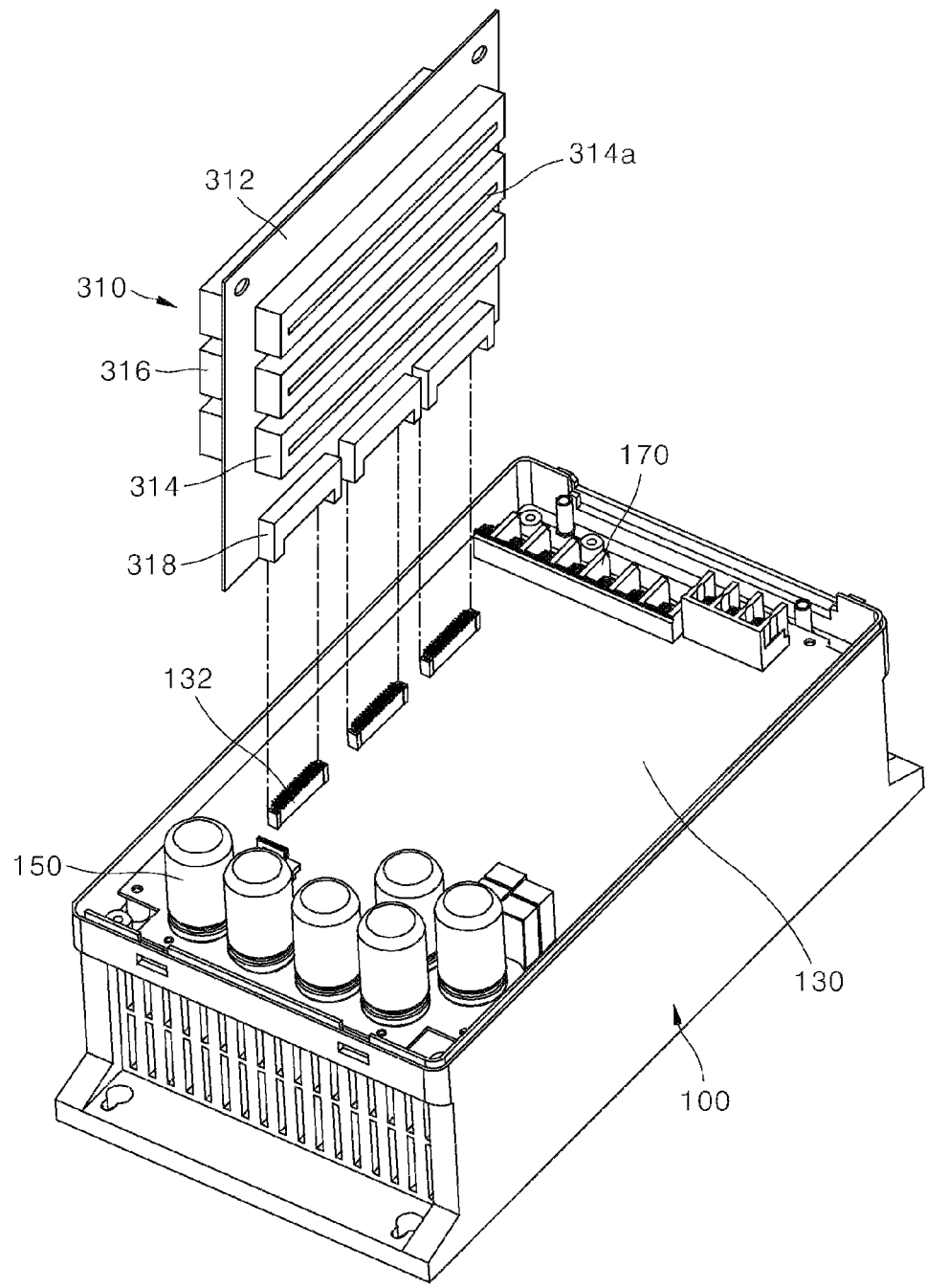
FIG. 3 is a partial exploded perspective view of a lower casing and a main PCB of the inverter module according to FIG. 1.
Figure 4:
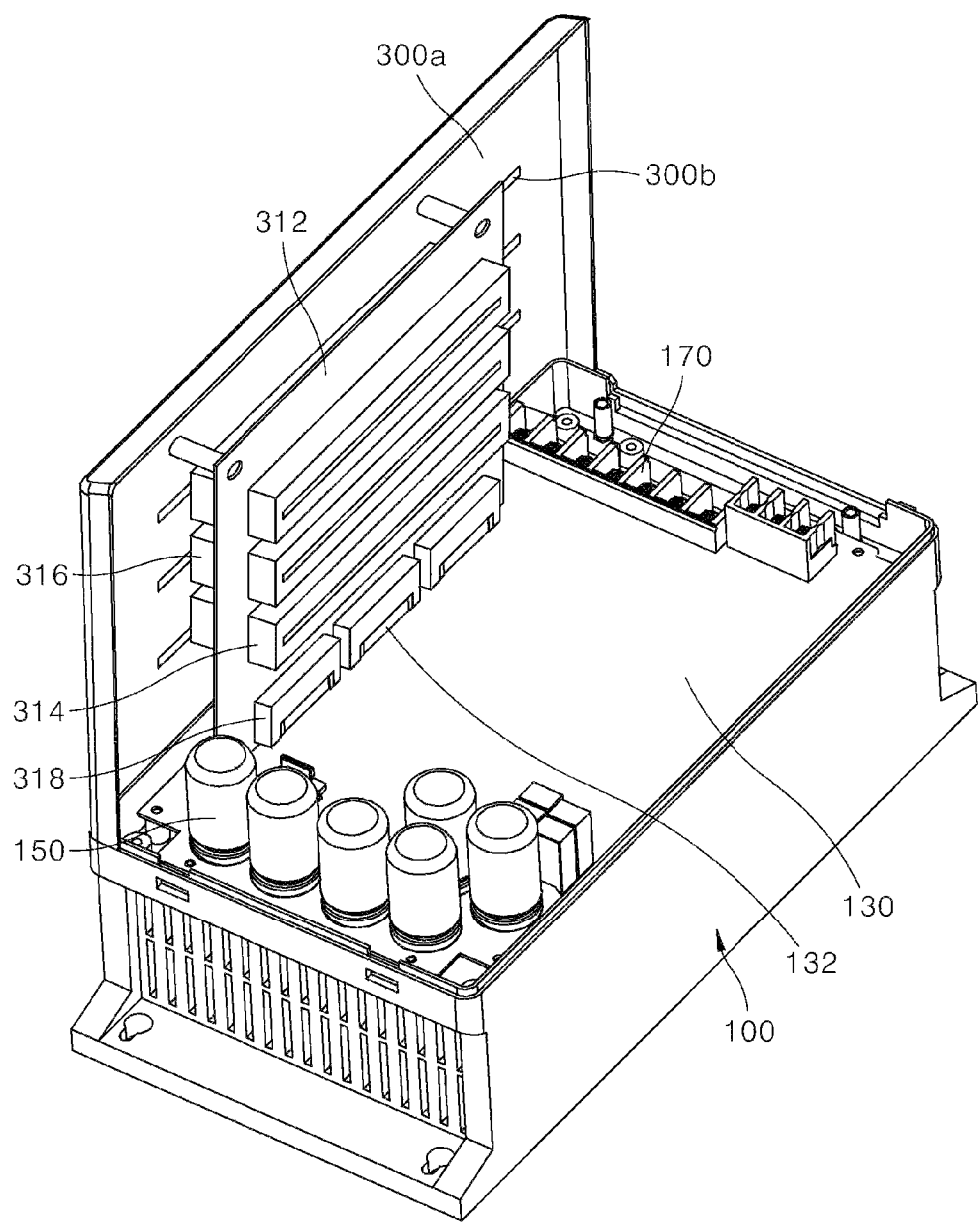
FIG. 4 is a perspective view of a combined state of the lower casing and the main PCB of the inverter module according to FIG. 3.
Figure 5:
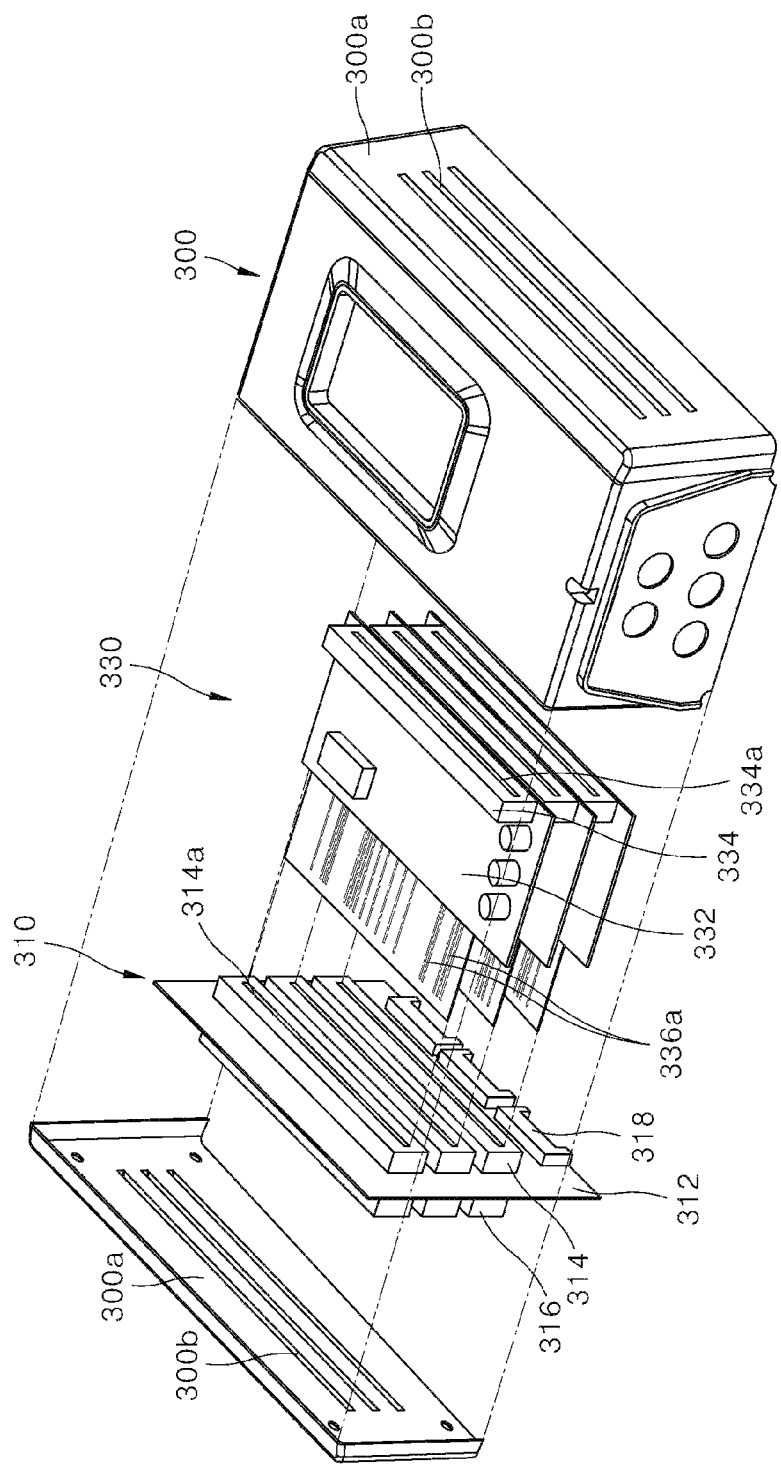
FIG. 5 is an exploded perspective view showing a main PCB and an auxiliary PCB of the inverter module according to FIG. 1.
Figure 6:
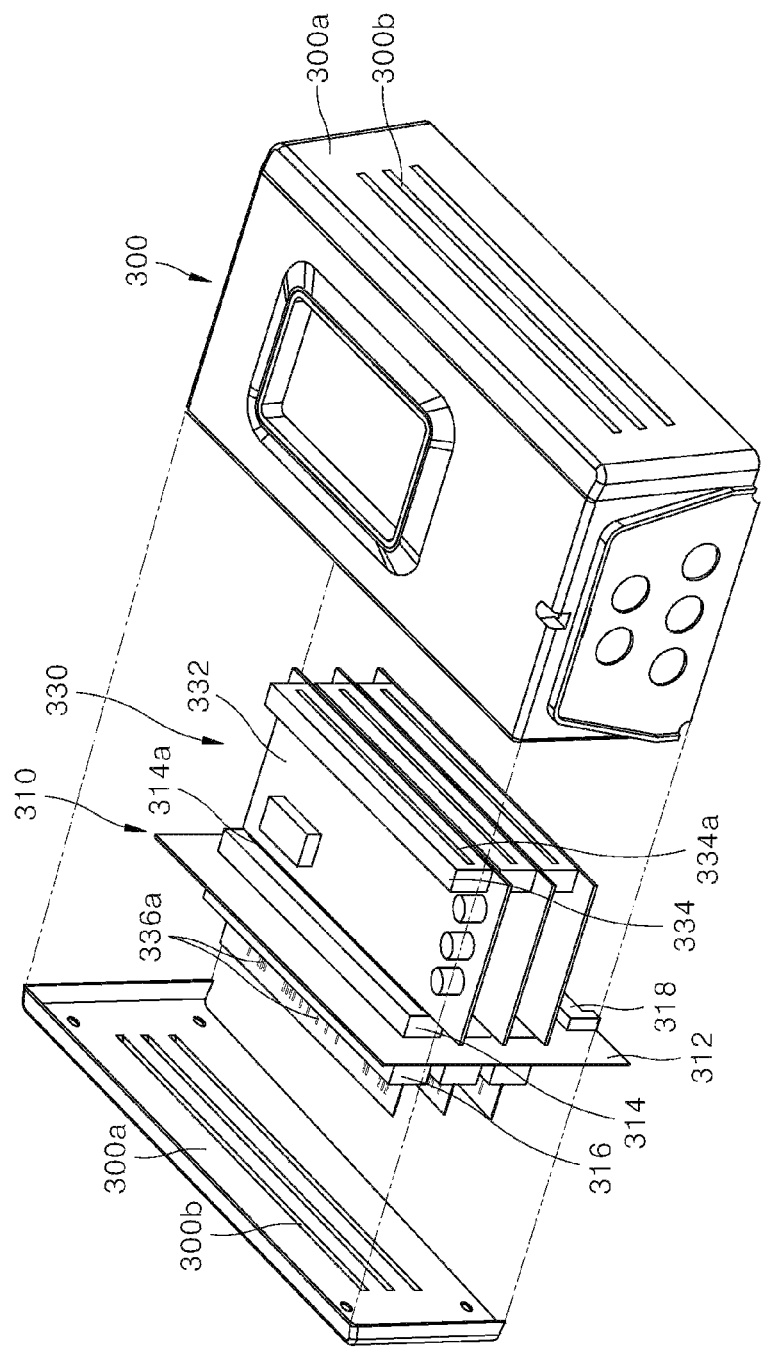
FIG. 6 is a perspective view showing of a combined state of the main PCB and the auxiliary PCB of the inverter module according to FIG. 5.
Figure 7:
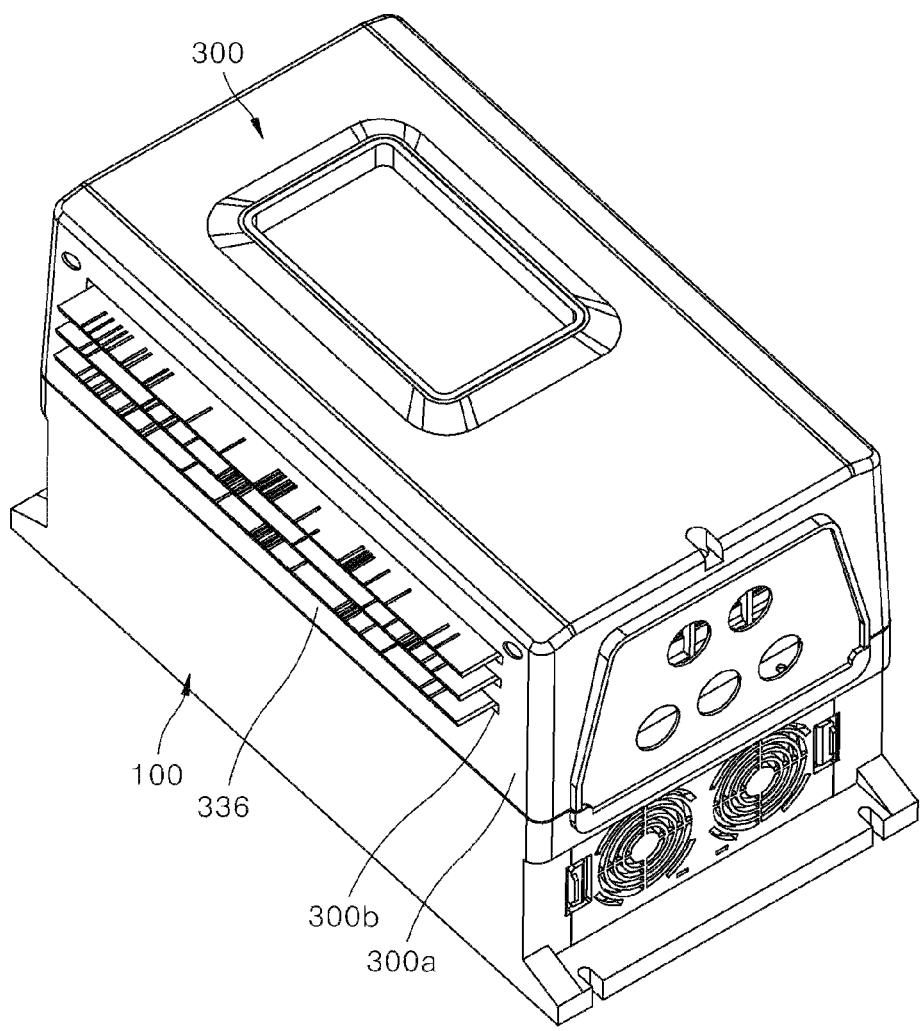
FIG. 7 is a perspective view in another direction showing the inverter module according to FIG. 1.

FIG. 1 is a perspective view showing an inverter module according to one embodiment of the present disclosure. FIG. 2 is a partial exploded perspective view of the inverter module according to FIG. 1. FIG. 3 is a partial exploded perspective view of a lower casing and a main PCB of the inverter module according to FIG. 1. FIG. 4 is a perspective view of a combined state of the lower casing and the main PCB of the inverter module according to FIG. 3. FIG. 5 is an exploded perspective view showing a main PCB and an auxiliary PCB of the inverter module according to FIG. 1. FIG. 6 is a perspective view showing of a combined state of the main PCB and the auxiliary PCB of the inverter module according to FIG. 5. FIG. 7 is a perspective view in another direction showing the inverter module according to FIG. 1 (hereinafter, a direction corresponding to a long side of each of upper and lower casings is defined as a longitudinal direction, while a direction corresponding to a short side thereof is defined as a width direction).

As shown in FIG. 1 to FIG. 4, in an inverter module 10 according to one embodiment of the present disclosure, a lower casing 100 and an upper casing 300 are mutually coupled to each other to form one module. One inverter module 10 may be coupled to and interact with another inverter module 10 to constitute one inverter system (this will be described later).

The lower casing 100 has a receiving space defined therein to accommodate therein components such as a heat-dissipation fan 110 and a heat sink (not shown). A middle plate 130 is attached to a top of the receiving space to cover the receiving space. A plurality of capacitors 150 and a plurality of terminal blocks 170 extend through the middle plate 130 in a mounted manner. That is, a portion each of the capacitor 150 and the terminal block 170 is positioned in the receiving space while another portion thereof is disposed above the middle plate 130 and is exposed upwardly.

The middle plate 130 has a plate structure that is coupled to the lower casing 100 and covers the receiving space. The middle plate 130 supports the capacitors 150, the terminal blocks 170, and a main PCB 310 to be described later. A plurality of plate connectors 132 are formed on a plate plane of the middle plate 130.

The plurality of plate connectors 132 are arranged along a longitudinal direction of the lower casing 100. The plate connectors 132 protrude upwardly from a top face of the middle plate 130 and are arranged in a line. The main PCB 310 is connected to the plate connectors 132. The plate connectors 132 are coupled to the main PCB 310 to support the main PCB 310. The plate connectors 132 are electrically connected to the main PCB 310 disposed in the upper casing 300.

The upper casing 300 has a receiving space defined therein which is downwardly open and is coupled to a top of the lower casing 100. The receiving space of the upper casing 300 accommodates therein the main PCB 310, auxiliary PCBs 330, a portion of each of the capacitors 150, and a portion of each of the terminal blocks 170. The upper casing 300 has a side panel 300a. A plurality of panel slits 300b are defined in the side panel 300a. Each panel slit 300b extends in a longitudinal direction of the side panel 300a.

Each auxiliary PCB 330 which will be described later extends outwardly through each panel slit 300b such that a portion of each auxiliary PCB 330 is exposed outwardly. Therefore, the panel slit 300b passe through the side panel 300a and has a length greater than a length of the auxiliary PCB 330.

The main PCB 310 includes a main board 312 coupled to the middle plate 130, a first connector 314 formed on one face of the main board 312, a second connector 316 formed on the opposite face of the main board 312, and an auxiliary connector 318 disposed at one end in a longitudinal direction of the main board 312.

The main board 312 refers to a board on which a main circuit for controlling a motor or a pump connected to the inverter module 10 and for performing basic control of the inverter module 10 is printed and various components are mounted. Further, the main board 312 may be equipped with a circuit or a component for communicating with the auxiliary PCBs 330 or for processing data transmitted from the auxiliary PCBs 330.

A plurality of first connectors 314 and a plurality of second connectors 316 are respectively disposed on both opposing faces of the main board 312. A plurality of auxiliary connectors 318 are arranged along a long side of the main board 312. The main board 312 is connected to the middle plate 130 when the auxiliary connectors 318 are respectively coupled to the plate connectors 132. The main board 312 is oriented so that a plate plane thereof is perpendicular to a plate plane of the middle plate 130.

The plurality of first connectors 314 are disposed on one face of the main board 312 and are arranged along the longitudinal direction. The first connectors 314 are arranged and spaced from each other at a preset spacing. Each slit 314a is formed in each first connector 314 so that each auxiliary PCB 330 which will be described later is inserted into each slit. The slit 314a passes through the first connector 314 and extends along the longitudinal direction of the first connector 314. A plurality of slots (not shown) for signal transmission and electrical connection may be formed on one side of the slit 314a. The first connectors 314 are away from and face toward the second connectors 316 while the main board 312 is interposed therebetween.

The plurality of second connectors 316 are arranged along the longitudinal direction of the main board 312 and are disposed on the opposite face of the main board 312. The plurality of second connectors 316 are arranged and spaced from each other at a preset spacing. Each slit (not shown) is formed in each second connector 316 so that each auxiliary PCB 330 which will be described later is inserted into each slit. The slit passes through the second connector 316 and extends along the longitudinal direction of the second connector 316. A plurality of slots (not shown) for signal transmission and electrical connection may be formed on one side of the slit. The second connectors 316 are away from and face toward the first connectors 314 while the main board 312 is interposed therebetween. However, the second connectors 316 may be omitted and an inserted portion of each auxiliary PCB 330 may be longer and thus may be directly connected to each first connector 314. That is, the second connectors 316 may be applied or omitted as needed.

An edge connector 336 of each auxiliary PCB 330 which will be described later passes through each first connector 314 and each second connector 316 and is exposed out of the second connector 316. To this end, each slit (not shown) passes through the main board 312. The slit defined in the main board 312 may have a length corresponding to a length of the slit 314a formed in each of the first connector 314 and the second connector 316.

In one example, the plurality of auxiliary connectors 318 are formed at one end of the main PCB 310 and are arranged in the longitudinal direction thereof and are respectively coupled to the plurality of plate connectors 132 of the middle plate 130. Since the main PCB 310 is oriented to be perpendicular to the middle plate 130, the auxiliary connectors 318 are disposed at not a plate plane but an edge of the main PCB 310.

When the auxiliary connectors 318 are respectively engaged with the plate connectors 132, the main PCB 310 may be coupled onto the middle plate 130. The auxiliary connectors 318 serves to mechanically couple the main PCB 310 to the middle plate 130 and at the same time electrically connect the main PCB 310 to the middle plate 130. Therefore, each auxiliary connector 318 preferably has a shape corresponding to that of each plate connector 132. That is, when one of the auxiliary connector 318 and the plate connector 132 has a protruding shape, the other thereof may have a recess shape that may receive the protruding shape. Further, each of the auxiliary connector 318 and the plate connector 132 may have a slot (not shown) for signal transmission and electrical connection.

Due to the above structure, the main PCB 310 may be coupled to the middle plate 130, and the plurality of auxiliary PCBs 330 may be coupled to the main PCB 310. Hereinafter, the coupling structure between the main PCB 310 and the auxiliary PCBs 330 will be described.

As shown in FIG. 5 to FIG. 7, the auxiliary PCBs 330 are coupled to the main PCB 310 while being inserted through the main PCB 310. While the auxiliary PCBs 330 are connected to the main PCB 310, an outer portion of each of the auxiliary PCBs 330 is exposed out of the side panel 300a of the upper casing 300.

Each auxiliary PCB 330 includes an auxiliary board 332, a third connector 334 to be connected to another auxiliary PCB 330, and an edge connector 336 to be connected to the main PCB 310.

A component for fault diagnosis of the inverter module 10 itself or fault diagnosis of the motor or the pump, a component that converts external power to to-be-used power, a component for communication with the main PCB 310, and a component for additional data storage, various sensors, etc. may be installed on one face of the auxiliary board 332. The third connector 334 is disposed at one side in a width direction of the auxiliary board 332 while the edge connector 336 is disposed at the opposite side in the width direction of the auxiliary board 332.

The auxiliary board 332 is oriented so that a plate plane thereof is perpendicular to the plate plane of the main PCB 310. In this state, the edge connector 336 passes through the first connector 314 and the second connector 316 of the main PCB 310.

The third connector 334 may be disposed on the top face of the auxiliary PCB 330 and extend along a longitudinal direction thereof. In this connection, the top face refers to the plate plane on which the various components described above are mounted. A slit 334a passes through the third connector 334 and extends along the longitudinal direction thereof. In this connection, the slit 334a may be closer to a top face of the auxiliary PCB 330 than to a top face of the third connector 334.

Alternatively, the third connector 334 may be disposed on a side face of one edge of each auxiliary PCB 330 and extend in a longitudinal direction thereof. In this connection, the slit 334a may be coplanar with the plate plane of the auxiliary PCB 330.

When the plurality of inverter modules 10 are coupled to each other, and when a spacing between the slit 334a and the plate plane of the auxiliary PCBs 330 increases, a difference between vertical levels of the auxiliary PCBs 330 coupled to each other may increase. To reduce this difference and align the auxiliary PCBs 330 with each other, the spacing between the slit 334a and the plate plane of the auxiliary PCB 330 may be as small as possible.

The slit 334a faces toward one of side panels 300a of the upper casing 300. When the inverter modules 10 are connected to each other, the slit 334a receives the edge connector 336 of the corresponding inverter module 10 exposed outwardly and toward another inverter module 10 neighboring thereto (this will be described later). Based on FIG. 5, the slit 334a may face toward a right side panel 300a of the upper casing 300, and the edge connector 336 may face toward a left side panel 300a thereof.

The edge connector 336 extends along the longitudinal direction of the auxiliary PCB 330 and is disposed at one side of the auxiliary PCB 330 opposite to the third connector 334. The edge connector 336 refers to an exposed portion of each of a plurality of slots 336a electrically connected to various components mounted on the auxiliary board 332. At the same time, the edge connector 336 serves to connect the auxiliary PCB 330 to the main PCB 310. Further, the edge connector 336 is exposed out of the side panel 300a and serves to interconnect the inverter modules 10 to each other when the inverter modules 10 are connected to each other.

The slot 336a is formed on the edge connector 336. A slot for signal transmission is also formed on the first connector 314 and the second connector 316 of the main PCB 310. Therefore, when the edge connector 336 is connected to the first connector 314 and the second connector 316, the main PCB 310 and the auxiliary PCB 330 are electrically connected to each other to transmit and receive signals therebetween.

In this connection, the main PCB 310 and the auxiliary PCB 330 may communicate a signal for communication with each other. Alternatively, all control signals of the auxiliary PCB 330 may be transmitted to the main PCB 310. Alternatively, signals of the auxiliary PCB 330 that need to be processed directly by the main PCB 310 may be selected and transmitted to the main PCB 310. This signal processing may be applied during design or via change of a control signal of the main PCB 310.

As described above, in one inverter module 10, the plurality of auxiliary PCBs 330 are coupled to the single main PCB 310. Thus, a desired auxiliary PCB 330 may be easily attached and detached from the main PCB when necessary. Therefore, replacement of the auxiliary PCB 330 or component upgrade may be easily carried out.

Further, one inverter module 10 has a structure in which the edge connector 336 of the auxiliary PCB 330 protrudes outwardly, and an edge connector 336 of another inverter module 10 is coupled to the auxiliary PCB 330. The auxiliary PCB 330 and the main PCB 310 are electrically connected to each other and communicate each other. Thus, the plurality of inverter modules 10 are connected to each other to implement a single inverter system.

In this connection, data or signals processed by the auxiliary PCBs 330 of each inverter module 10 are transmitted to the main PCB 310 of each inverter module 10. The signal transmitted to the main PCB 310 of each inverter module 10 is processed by the main PCB 310 of each inverter module 10, as needed, or is used for controlling the auxiliary PCB 330 or the components. The main PCBs 310 of the inverter modules 10 may communicate with each other via the auxiliary PCB 330 connected therebetween.

Hereinafter, an example in which the plurality of inverter modules 10 are coupled to each other to constitute one inverter system will be described (a component not shown in FIG. 8 has been described with reference to the reference signs in FIG. 1 to FIG. 7).

Figure 8:
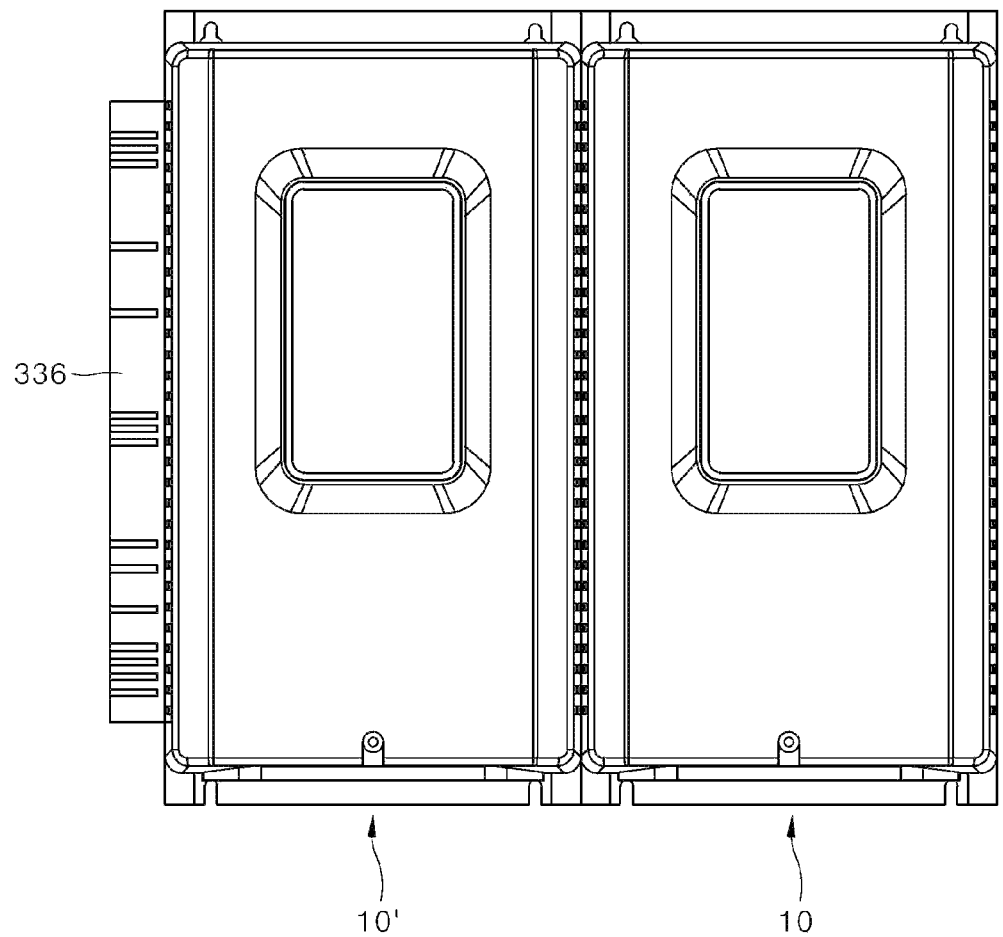
FIG. 8 is a diagram showing an inverter system in which a plurality of inverter modules according to one embodiment of the present disclosure are connected to each other.

FIG. 8 is a diagram showing an inverter system in which a plurality of inverter modules according to one embodiment of the present disclosure are connected to each other.

As shown in FIG. 5, FIG. 6, and FIG. 8, each of the plurality of inverter modules 10 and 10' includes a main PCB 310 and auxiliary PCBs 330. The main PCB 310 is coupled to the auxiliary PCBs 330 to support the auxiliary PCBs 330. The auxiliary PCB 330 has the third connector 334 at one side thereof into which an edge connector 336 of another auxiliary PCB 330 is inserted, and has an edge connector 336 at the opposite side thereof. The plurality of inverter modules 10 and 10' have the same structure.

Therefore, in one inverter module 10, the edge connector 336 of each auxiliary PCB 330 protrudes out of one side panel 300a of the upper casing 300. When one inverter module 10 is coupled to another inverter module 10', coupling between the inverter modules 10 and 10' is completed by inserting and pressurizing the edge connector 336 into the opposite side panel 300a of the upper casing 300.

In this way, the plurality of inverter modules 10 and 10' may be coupled to each other to construct an inverter system corresponding to the required capacity.

For example, when assuming that each individual inverter module 10 has a capacity of 100 kW, three inverter modules 10 may be combined with each other to constitute an inverter system with a capacity of 300 kW. When an inverter system with a capacity of 500 kW is required, five inverter modules 10 may be coupled to each other.

When the plurality of inverter modules 10 and 10' are connected to each other to form one inverter system, each of the inverter modules 10 and 10' may operate individually or the inverter modules 10 and 10' may operate in an associated manner with each other to operate as one inverter. To this end, a controller or circuit which performs main control when a plurality of inverter modules 10 and 10' are connected to each other may be disposed on the main PCB 310 of each of the inverter modules 10. A controller of any one of the plurality of inverter modules 10 and 10' may function as a main controller to control the plurality of inverter modules 10 and 10' (for example, a controller of an inverter module positioned at a first position may function as the main controller).

As described above, the inverter modules according to the present disclosure may be combined with each other in a simple manner to constitute one inverter system. Therefore, an inverter system of a required capacity may be easily designed and assemblability and appearance thereof may be improved.

The present disclosure as described above may be subjected to various substitutions, modifications and changes within the scope that does not depart from the technical spirit of the present disclosure by those of ordinary skill in the technical field to which the present disclosure belongs. Thus, the present disclosure is not limited to the above-described embodiments and the attached drawings.

What is claimed is:

1. An inverter module to be coupled to a further inverter module, the inverter module comprising:
    a main printed circuit board (PCB) including a main board having a first face and a second face opposite to the first face;
    a plurality of auxiliary PCBs coupled to the main PCB, wherein each auxiliary PCB passes through the main PCB, such that each auxiliary PCB has a first end exposed from the first face and a second end, opposite to the fist end, exposed from the second face; and
    a casing for accommodating the main PCB and the plurality of auxiliary PCBs,
    wherein one end of at least one of the plurality of auxiliary PCBs is exposed out of the casing and is coupled to the further inverter module adjacent to the inverter module.

2. The inverter module of claim 1, wherein the main PCB further includes a plurality of first connectors formed on the first face of the main board,
    wherein each first connector has a slit passing therethrough, wherein each auxiliary PCB is inserted through the slit.

3. The inverter module of claim 2, wherein the main PCB further includes a plurality of second connectors formed on the second of the main board,
    wherein each second connector has a slit passing therethrough, wherein the auxiliary PCB passing through the slit of the first connector is inserted into the slit of the second connector.

4. The inverter module of claim 2, wherein each of the plurality of auxiliary PCBs includes:
    an auxiliary board;
    an edge connector disposed at a first side of the auxiliary board and passing through the first connector; and
    a third connector disposed at a second side of the auxiliary board, opposite to the first side,
    wherein a plurality of slots electrically connected to a circuit of the auxiliary board are disposed on the edge connector,
    wherein an edge connector of the further inverter module is inserted into the third connector.

5. The inverter module of claim 4, wherein a plate plane of the auxiliary board is perpendicular to a plate plane of the main board.

6. The inverter module of claim 1, wherein the casing has a plurality of slits passing through both opposing side faces thereof,
    wherein one end of the at least one auxiliary PCB passes through the slits of one of the both opposing side faces of the casing and protrudes out of one of the both opposing side faces of the casing.

7. An inverter module to be coupled to a further inverter module having the same capacity as a capacity of the inverter module, the inverter module comprising:
    a lower casing having a lower receiving space defined therein;
    an upper casing coupled to a top of the lower casing and having an upper receiving space defined therein;
    a plate-shaped middle plate coupled to and disposed between the lower casing and the upper casing;
    a main PCB having one end coupled to the middle plate and the other end extending in a direction away from the middle plate, wherein the main PCT has a first face and a second face opposite to the first face, wherein the main PCB is accommodated in the upper receiving space; and
    a plurality of auxiliary PCBs, wherein each of the plurality of auxiliary PCBs has a first end coupled to the main PCB and passing through the main PCB, such that the first end is exposed from the first face and a second end, opposite to the first end, is exposed from the second face, wherein the second end of each auxiliary PCB is exposed out of the upper casing while each auxiliary PCB is accommodated in the upper receiving space,
    wherein when the inverter module is coupled to the further inverter module, one end of each auxiliary PCB exposed out of the upper casing is inserted into the further inverter module adjacent to the inverter module.

8. The inverter module of claim 7, wherein the main PCB includes:
    a main board; and
        a plurality of first connectors formed on the first face of the main board,
        wherein each first connector has a slit passing therethrough, wherein each auxiliary PCB is inserted through the slit.

9. The inverter module of claim 8, wherein the main PCB further includes a plurality of second connectors formed on the second face of the main board,
    wherein each second connector has a slit passing therethrough, wherein the auxiliary PCB passing through the slit of the first connector is inserted through the slit of the second connector.

10. The inverter module of claim 8, wherein each of the plurality of auxiliary PCBs includes:
    an auxiliary board;
    an edge connector disposed at a first side of the auxiliary board and passing through the first and second connectors; and
    a third connector disposed at a second side opposite to the first side of the auxiliary board, wherein a plurality of slots electrically connected to a circuit of the auxiliary board are disposed on the edge connector, wherein an edge connector of the further inverter module is inserted into the third connector.

11. The inverter module of claim 10, wherein a plate plane of the auxiliary board is perpendicular to a plate plane of the main board.

12. The inverter module of claim 7, wherein the casing has a plurality of slits passing through both opposing side faces thereof, wherein one end of the at least one auxiliary PCB passes through the slits of one of the both opposing side faces of the casing and protrudes out of one of the both opposing side faces of the casing.

* * * * *